US010856376B2

United States Patent
Song et al.

(10) Patent No.: US 10,856,376 B2
(45) Date of Patent: *Dec. 1, 2020

(54) PRINTED CIRCUIT BOARD FOR INTEGRATED LED DRIVER

(71) Applicant: Lumileds LLC, San Jose, CA (US)

(72) Inventors: Zhihua Song, San Jose, CA (US); Wouter Soer, San Jose, CA (US); Ron Bonne, San Jose, CA (US); Yifeng Qiu, San Jose, CA (US)

(73) Assignee: Lumileds LLC, San Jose, CA (US)

( * ) Notice: Subject to any disclaimer, the term of this patent is extended or adjusted under 35 U.S.C. 154(b) by 23 days.

This patent is subject to a terminal disclaimer.

(21) Appl. No.: 16/184,565

(22) Filed: Nov. 8, 2018

(65) Prior Publication Data

US 2019/0166669 A1 May 30, 2019

Related U.S. Application Data

(63) Continuation of application No. 15/587,567, filed on May 5, 2017, now Pat. No. 10,165,640.

(Continued)

(30) Foreign Application Priority Data

Sep. 27, 2016 (EP) .................................... 16190841

(51) Int. Cl.
*H05B 45/10* (2020.01)
*H05K 1/05* (2006.01)
(Continued)

(52) U.S. Cl.
CPC ........... *H05B 45/10* (2020.01); *H01L 25/167* (2013.01); *H01L 25/50* (2013.01);
(Continued)

(58) Field of Classification Search
CPC .. H05K 1/0215; H05K 1/0224; H05K 1/0262; H05K 1/024; H05K 1/0251;
(Continued)

(56) References Cited

U.S. PATENT DOCUMENTS 4,758,922 A 7/1988 Ishigaki et al.
4,902,610 A 2/1990 Shipley
(Continued)

FOREIGN PATENT DOCUMENTS

JP 11-340515 A 12/1999
JP 2001-196635 A 7/2001
(Continued)

OTHER PUBLICATIONS

"Japanese Application Serial No. 2019-500482, Notification of Reasons for Rejection dated Mar. 10, 2020", (w/ English Translation), 6 pgs.

(Continued)

*Primary Examiner* — Sophia T Nguyen
(74) *Attorney, Agent, or Firm* — Schwegman Lundberg & Woessner, P.A.

(57) ABSTRACT

A light emitting diode (LED) module may include a direct current (DC) voltage node formed on a first layer. The DC voltage node may be configured to sink a first current. One or more devices may be formed on the first layer configured to provide a second current to one or more LEDs. A device of the one or more devices may carry a steep slope voltage waveform. A local shielding area may be formed in a second layer directly below the DC voltage node and the one or more devices. The local shielding area may include a substantially continuous area of conductive material. A conductive via may extend through one or more layers. The conductive via may electrically connect the DC voltage node and the local shielding area.

20 Claims, 6 Drawing Sheets

Related U.S. Application Data (60) Provisional application No. 62/359,112, filed on Jul. 6, 2016.

(51) Int. Cl.
| | |
|---|---|
| *H05K 3/40* | (2006.01) |
| *H05K 1/11* | (2006.01) |
| *H05K 3/44* | (2006.01) |
| *H05K 3/46* | (2006.01) |
| *H05B 45/50* | (2020.01) |
| *H05K 1/02* | (2006.01) |
| *H05K 3/00* | (2006.01) |
| *H01L 25/16* | (2006.01) |
| *H01L 25/00* | (2006.01) |
| *H05K 3/10* | (2006.01) |
| *H05K 3/14* | (2006.01) |
| *H01R 13/6591* | (2011.01) |
| *H05K 9/00* | (2006.01) |
| *H05B 45/37* | (2020.01) |
| *H05K 1/18* | (2006.01) |
| *H05K 3/30* | (2006.01) |
| *H05K 3/18* | (2006.01) |
| *H05K 3/16* | (2006.01) |
| *H05K 13/00* | (2006.01) |

(52) U.S. Cl.
CPC ......... *H01R 13/6591* (2013.01); *H05B 45/37* (2020.01); *H05B 45/50* (2020.01); *H05K 1/0203* (2013.01); *H05K 1/0215* (2013.01); *H05K 1/0224* (2013.01); *H05K 1/0243* (2013.01); *H05K 1/053* (2013.01); *H05K 1/056* (2013.01); *H05K 1/111* (2013.01); *H05K 1/115* (2013.01); *H05K 1/181* (2013.01); *H05K 3/0061* (2013.01); *H05K 3/107* (2013.01); *H05K 3/146* (2013.01); *H05K 3/303* (2013.01); *H05K 3/4076* (2013.01); *H05K 3/44* (2013.01); *H05K 3/465* (2013.01); *H05K 3/467* (2013.01); *H05K 3/4608* (2013.01); *H05K 3/4644* (2013.01); *H05K 9/0084* (2013.01); *H05K 9/0088* (2013.01); *H05K 1/024* (2013.01); *H05K 1/0251* (2013.01); *H05K 1/0262* (2013.01); *H05K 3/16* (2013.01); *H05K 3/181* (2013.01); *H05K 3/4661* (2013.01); *H05K 3/4679* (2013.01); *H05K 3/4688* (2013.01); *H05K 13/00* (2013.01); *H05K 2201/066* (2013.01); *H05K 2201/0723* (2013.01); *H05K 2201/093* (2013.01); *H05K 2201/09327* (2013.01); *H05K 2201/09563* (2013.01); *H05K 2201/10106* (2013.01); *H05K 2201/10166* (2013.01); *H05K 2201/10522* (2013.01)

(58) Field of Classification Search
CPC .. H05K 1/0243; H05K 9/0084; H05K 9/0088; H05K 2201/10166; H05K 2201/093; H05K 2201/0723; H05K 2201/09327; H01L 23/66
See application file for complete search history.

(56) References Cited

U.S. PATENT DOCUMENTS

| | | | |
|---|---|---|---|
| 4,915,983 A * | 4/1990 | Lake | H01L 21/4857 |
| | | | 156/150 |
| 4,998,159 A | 3/1991 | Shinohara et al. | |
| 5,153,986 A | 10/1992 | Brauer et al. | |
| 5,274,912 A * | 1/1994 | Olenick | H05K 3/4617 |
| | | | 174/262 |
| 5,396,397 A | 3/1995 | McClanahan et al. | |
| 5,819,401 A | 10/1998 | Johannes et al. | |
| 6,175,084 B1 | 1/2001 | Saitoh et al. | |
| 6,175,087 B1 | 1/2001 | Keesler et al. | |
| 6,324,755 B1 | 12/2001 | Borkowski et al. | |
| 6,388,202 B1 | 5/2002 | Swirbel et al. | |
| 6,388,205 B1 | 5/2002 | Chua | |
| 6,414,247 B1 | 7/2002 | Nakai et al. | |
| 6,726,488 B2 | 4/2004 | Shirasaki | |
| 6,817,870 B1 | 11/2004 | Kwong et al. | |
| 7,119,437 B2 | 10/2006 | Morita et al. | |
| 7,165,863 B1 | 1/2007 | Thomas et al. | |
| 7,193,490 B2 | 3/2007 | Shimoda | |
| 7,294,791 B2 | 11/2007 | Danoski et al. | |
| 7,730,613 B2 | 6/2010 | Vasoya | |
| 8,384,097 B2 * | 2/2013 | Yan | F21K 9/00 |
| | | | 257/666 |
| 9,014,520 B2 | 4/2015 | Yanagisawa | |
| 9,812,429 B2 | 11/2017 | Das et al. | |
| 10,400,958 B2 * | 9/2019 | Vampola | H01L 25/0753 |
| 2002/0015293 A1 | 2/2002 | Akiba et al. | |
| 2003/0151477 A1 | 8/2003 | Hirabayashi et al. | |
| 2003/0193055 A1 | 10/2003 | Matter et al. | |
| 2004/0034489 A1 | 2/2004 | Ogino et al. | |
| 2004/0107569 A1 | 6/2004 | Guzek et al. | |
| 2005/0184381 A1 | 8/2005 | Asahi et al. | |
| 2005/0213309 A1 | 9/2005 | Hiratsuka et al. | |
| 2006/0018462 A1 | 1/2006 | Cregan et al. | |
| 2006/0291178 A1 | 12/2006 | Shih | |
| 2007/0069932 A1 | 3/2007 | Isoda | |
| 2007/0103257 A1 | 5/2007 | Murata | |
| 2007/0226998 A1 | 10/2007 | Olson et al. | |
| 2008/0024998 A1 | 1/2008 | Hsu | |
| 2008/0117609 A1 | 5/2008 | Itou et al. | |
| 2008/0185607 A1 | 8/2008 | Park | |
| 2008/0258695 A1 | 10/2008 | Kumar et al. | |
| 2010/0108370 A1 | 5/2010 | Kapusta et al. | |
| 2011/0090665 A1 * | 4/2011 | Korony | H01C 1/148 |
| | | | 361/821 |
| 2011/0199773 A1 | 8/2011 | Bizzotto et al. | |
| 2011/0304681 A1 | 12/2011 | Okazaki | |
| 2012/0168214 A1 | 7/2012 | Kashiwagi et al. | |
| 2013/0180763 A1 | 7/2013 | Moul et al. | |
| 2013/0220690 A1 | 8/2013 | Chang et al. | |
| 2013/0322029 A1 | 12/2013 | Hurwitz | |
| 2014/0054077 A1 | 2/2014 | Minamio et al. | |
| 2014/0231837 A1 | 8/2014 | Singer et al. | |
| 2014/0369642 A1 | 12/2014 | Yanagisawa | |
| 2015/0015152 A1 | 1/2015 | Aboulnaga et al. | |
| 2015/0016078 A1 | 1/2015 | Yang et al. | |
| 2015/0030830 A1 | 1/2015 | Adachi et al. | |
| 2015/0319868 A1 | 11/2015 | Wei et al. | |
| 2015/0377437 A1 | 12/2015 | Austerer et al. | |
| 2016/0149088 A1 * | 5/2016 | Yan | H01L 25/0753 |
| | | | 257/48 |
| 2017/0025361 A1 | 1/2017 | Lee et al. | |
| 2017/0095582 A1 | 4/2017 | Shur et al. | |
| 2017/0159891 A1 | 6/2017 | Yanwei | |
| 2017/0159916 A1 | 6/2017 | Yanwei | |
| 2017/0208683 A1 | 7/2017 | Yu et al. | |
| 2017/0288088 A1 | 10/2017 | Won Cheol | |
| 2018/0014373 A1 | 1/2018 | Song et al. | |
| 2019/0090323 A1 * | 3/2019 | Yan | H05B 33/0842 |
| 2019/0123094 A1 * | 4/2019 | Foster | H05B 33/0842 |

FOREIGN PATENT DOCUMENTS

| | | |
|---|---|---|
| JP | 2014-240933 A | 12/2014 |
| WO | 2015/144524 | 10/2015 |

OTHER PUBLICATIONS

"International Application Serial No. PCT US2017 031256, Reply filed Jan. 28, 2019 to International Search Report and Written Opinion dated Jul. 5, 2017", 11 pgs.

(56) References Cited

OTHER PUBLICATIONS

"International Application Serial No. PCT US2017 031256, International Search Report dated Jul. 5, 2017", 4 pgs.
"International Application Serial No. PCT US2017 031256, Written Opinion dated Jul. 5, 2017", 7 pgs.
"International Application Serial No. PCT US2017 031256, International Preliminary Report on Patentability dated Jan. 17, 2019", 9 pgs.
"Taiwanese Application Serial No. 106114976, Office Action dated Jun. 9, 2020", (w/ English Translation), 21 pgs.
"Chinese Application Serial No. 201780054755.1, Office Action dated Jul. 17, 2020", (w/ English Translation), 9 pgs.
"Korean Application Serial No. 10-2019-7003422, Response filed Aug. 19, 2020 to Notice of Preliminary Rejection dated Jun. 22, 2020", (w/ English Translation of Claims), 16 pgs.
U.S. Appl. No. 15/587,567, filed May 5, 2017, Printed Circuit Board for Integrated LED Driver.
U.S. Appl. No. 16/871,968, filed May 11, 2020, Printed Circuit Board for Integrated LED Driver.
"Taiwanese Application Serial No. 105130551, Decision of Rejection dated Sep. 29, 2020", (w/ English Translation), 23 pgs.

\* cited by examiner

PRINTED CIRCUIT BOARD FOR INTEGRATED LED DRIVER

CROSS REFERENCE TO RELATED APPLICATIONS

This application is a continuation of U.S. patent application Ser. No. 15/587,567, filed on May 5, 2017, which claims the benefit of U.S. Provisional Application No. 62/359,112 filed on Jul. 6, 2016 and European Patent Application No. 16190841 filed on Sep. 27, 2016, which are incorporated by reference as if fully set forth.

GOVERNMENT LICENSE RIGHTS

This invention was made with U.S. Government support under Contract No. DE-EE0006703 awarded by the Department of Energy (DOE). The Government has certain rights in this invention.

BACKGROUND

Light emitting diodes (LEDs) may produce a large amount of heat in some applications. One such application may be an array of high power LEDs used to form a light source for luminaires. The heat generated must be removed.

To accomplish this, the LEDs are typically mounted on a metal core printed circuit board (MCPCB) rather than using a conventional printed circuit board composed of a dielectric substrate, such as glass-reinforced epoxy laminate PCBs.

A MCPCB may include a metal substrate, such as aluminum, a dielectric layer over the metal substrate and a patterned metal layer over the dielectric layer. The patterned metal layer may be composed of copper. The patterned metal layer may connect the LEDs to a source of power. The metal substrate may then be thermally and/or electrically coupled to a grounded metal heat sink or it may be floating.

The MCPCB may have better thermal performance than other PCBs due to the relative thickness of the metal substrate which may improve lateral heat spreading and heat dissipation to a heat sink.

SUMMARY

A light emitting diode (LED) module may include a direct current (DC) voltage node formed on a first layer. The DC voltage node may be configured to sink a first current. One or more devices may be formed on the first layer configured to provide a second current to one or more LEDs. A device of the one or more devices may carry a steep slope voltage waveform. A local shielding area may be formed in a second layer directly below the DC voltage node and the one or more devices. The local shielding area may include a substantially continuous area of conductive material. A conductive via may extend through one or more layers. The conductive via may electrically connect the DC voltage node and the local shielding area.

BRIEF DESCRIPTION OF THE DRAWINGS

A more detailed understanding may be had from the following description, given by way of example in conjunction with the accompanying drawings wherein.

DETAILED DESCRIPTION

In the following description, numerous specific details are set forth, such as particular structures, components, materials, dimensions, processing steps, and techniques, in order to provide a thorough understanding of the present invention. However, it will be appreciated by one of ordinary skill of the art that the invention may be practiced without these specific details. In other instances, well-known structures or processing steps have not been described in detail in order to avoid obscuring the invention. It will be understood that when an element as a layer, region, or substrate is referred to as being "on" or "over" another element, it can be directly on the other element or intervening elements may also be present. In contrast, when an element is referred to as being "directly on" or "directly" over another element, there are no intervening elements present. It will also be understood that when an element is referred to as being "beneath," "below," or "under" another element, it can be directly beneath or under the other element, or intervening elements may be present. In contrast, when an element is referred to as being "directly beneath" or "directly under" another element, there are no intervening elements present.

In the interest of not obscuring the presentation of embodiments of the present invention, in the following detailed description, some processing steps or operations that are known in the art may have been combined together for presentation and for illustration purposes and in some instances may have not been described in detail. In other instances, some processing steps or operations that are known in the art may not be described at all. It should be understood that the following description is rather focused on the distinctive features or elements of various embodiments of the present invention.

The following description relates to light emitting diodes (LEDs) and a switching power supply driver mounted on the same metal core printed circuit board (MCPCB) and, in particular, to a technique to reduce unwanted electromagnetic interference (EMI) from the module.

When one or more light emitting diodes (LEDs) are mounted on a metal core printed circuit board (MCPCB), one or more devices that are configured to provide current to the one or more LEDs may also be mounted on the MCPCB. The one or more devices may include a LED driver to control the current. This arrangement may be referred to as a Driver On Board (DOB) module and may be used in a compact LED module. The LED driver may be a switching mode power supply (SMPS) that receives an unregulated voltage from an external power supply and supplies a regulated current to the LEDs to achieve a target brightness level.

Figure 1:
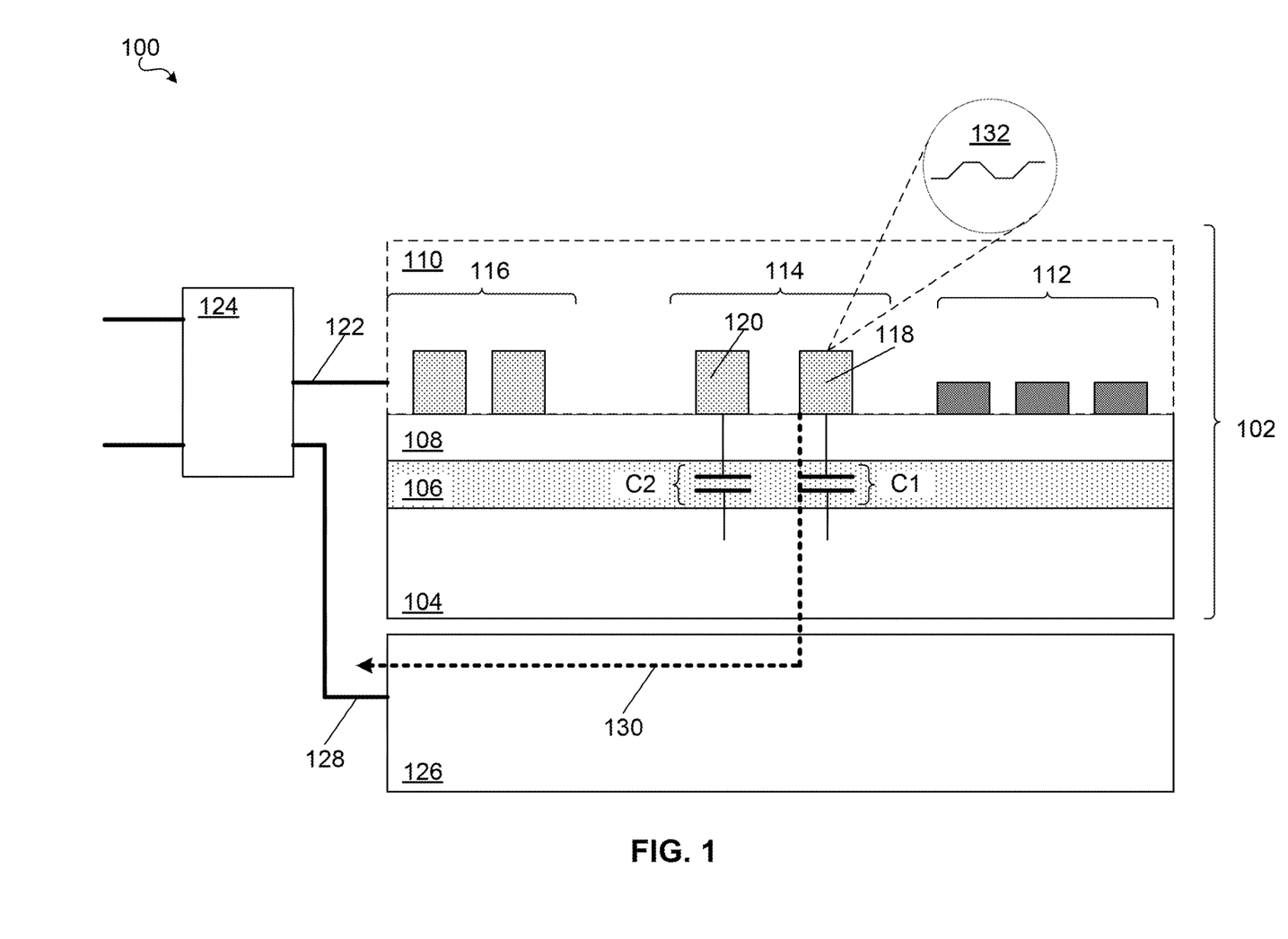
FIG. 1 is a cross-sectional view of a Driver On Board (DOB) module using a single layer metal core printed circuit board (MCPCB)

Referring to FIG. 1, a cross-sectional view of a Driver On Board (DOB) module 100 using a single layer MCPCB 102 is shown. As described above, the MCPCB 102 may include a base metal substrate 104, a dielectric layer 106 on the base metal substrate 104, a patterned metal layer 108 on the dielectric layer 106, and a device layer 110.

The base metal substrate 104 may be composed of one or more thermally conductive metals, such as, for example aluminum, copper, steel, or alloys thereof. The base metal substrate 104 may be, but is not limited to, several hundred microns thick. For example, the base metal substrate 104 may have a thickness ranging from approximately 0.5 mm to approximately 1.5 mm.

The base metal substrate 104 may have a dielectric layer 106 formed thereon. The dielectric layer 106 may include any thermally conductive dielectric materials, such as a dielectric polymer, a ceramic having a high thermal conductivity, and combinations thereof. The dielectric layer 106 may comprise a single layer of dielectric material or multiple layers of dielectric materials. The dielectric layer 106 may be formed using a conventional deposition or lamination process. The dielectric layer 106 may have a thickness ranging from approximately 30 μm to approximately 150 μm.

The dielectric layer 106 may have a patterned metal layer 108 formed thereon. The patterned metal layer 108 may provide one or more interconnections for circuitry on a device layer 110. The patterned metal layer 108 may be composed of a conductive material, such as polySi, a conductive metal, an alloy comprising at least one conductive metal, a conductive metal silicide, or combinations thereof. Preferably, the conductive material may be a conductive metal, such as Cu, W, or Al. The conductive material may be formed utilizing a conventional deposition or lamination process.

Although shown as one layer, one skilled in the art would understand that the patterned metal layer 108 may include multiple areas and/or layers of conductive material, insulated by one or more types of dielectric materials, for more complex circuits requiring cross-over conductors. The dielectric materials may be similar to the material in the dielectric layer 106 and may be formed using similar techniques before being patterned by one or more conventional lithography techniques. The patterned metal layer may have a thickness ranging from approximately 9 μm to approximately 70 μm.

As described above, the MCPCB 102 may also include the device layer 110 on the patterned metal layer 108. The device layer 110 may contain one or more devices and circuitry to provide a target current to one or more LEDs 112. The one or more devices may include a device that carries a steep slope voltage waveform, such as a switching transistor 118 of a SMPS 114. The device layer may contain the one or more LEDs 112, a SMPS 114, and neighboring circuitry 116. The one or more LEDs 112 may be two-lead semiconductor light sources, each of which may be a p-n junction diode that emits light when activated. When a suitable voltage is applied to the leads, electrons are able to recombine with electron holes within the device, releasing energy in the form of photons.

The SMPS 114 can be any type of converter that receives an input voltage and outputs a regulated current for driving the one or more LEDs 112, such as a step-up or step-down converter. The SMPS 114 may be a buck regulator, a boost regulator, or other type of switching regulator capable of providing the one or more LEDs 112 with a constant voltage.

The SMPS 114 may include the switching transistor 118 that switches on and off at a relatively high frequency, such as approximately 10 kHz to approximately 1 MHz. For example, the switching transistor 118 may couple an inductor between either a ground or a positive voltage at the high frequency, depending on the type of SMPS 114, to generate the boosted or decreased output voltage. The switching transistor 118 may be a metal-oxide-semiconductor field-effect transistor (MOSFET) or a bipolar transistor that carries a steep slope voltage waveform, which may be a square wave voltage 132, at the switching frequency.

It should be noted that the term "square wave," as used herein, does not require the waveform to have rectangular pulses. Neither does it require the waveform to have a duty cycle of 50% (i.e., having equal durations of high and low levels). In some applications, non-instantaneous switching and parasitic effects may result in non-rectangular waveforms. Accordingly, the term "square wave" means a switched voltage that swings between a high level and low level as a result of a switching transistor being turned on and off at times to achieve a target output voltage or current from the SMPS 114.

Accordingly, the high frequency square wave voltage 132 may be generated with a relatively high voltage (e.g., up to 500 V), and a relatively larger average current (e.g., up to 1 Amp). A small on-board capacitor may be used to somewhat filter the ripple to supply a regulated DC current to the one or more LEDs 112. In one example, the square wave voltage 132 may rapidly transition between ground and about 500 V to drive a string of one or more LEDs 112 connected in series.

There may be one or more devices adjacent to the switching transistor 118, such as, for example a controller 120. The controller 120 may use one or more known techniques to generate a target driving current for the one or more LEDs 112. In addition, the device layer 110 may include one or more additional devices 116. Although shown in close proximity to the switching transistor 118, the controller 120 may be located further away among the other devices 116.

The device layer 110 may be powered by a power supply 122 that is connected to an electromagnetic interference (EMI) measuring network 124 that may include one or more measurement devices known in the art. The EMI measuring network 124 may also be connected to a heat sink 126 through a physical earth (PE) connection 128, which may act as a ground to the DOB module 100. Due to the high frequency switching of potentially large currents and voltages, there is a potential for EMI. In some cases, the DOB module 100 may undergo a test to ensure the EMI is below a threshold for electromagnetic compatibility (EMC) with other systems. If the measured AC-coupled current into the heat sink 126 is above a threshold level, the DOB module 100 may fail an electromagnetic compatibility (EMC) test, which may be an industry or legal requirement.

As shown in FIG. 1, one or more parasitic capacitors may form in the DOB module 100. A first parasitic capacitor C1 may be formed with one capacitor terminal being a terminal of the switching transistor 118 carrying the square wave voltage 132 and/or the patterned metal layer 108 directly below the terminal and the other capacitor terminal being the base metal substrate 104 in the area below the switching transistor 118. The dielectric layer 106 may act as a capacitor dielectric. The first parasitic capacitor C1 may be charged and discharged every switching cycle. Large current spikes at the beginning and end of the square wave voltage 132 pulse, a result of the charging and discharging of the various capacitances, may generate EMI.

The capacitance value of the first parasitic capacitor C1 is proportional to the terminal area and inversely proportional to the dielectric thickness. Accordingly, the capacitance value of the first parasitic capacitor C1 may be high (e.g., dozens of pF) due to the thin dielectric layer 106, which is used for good thermal performance, and the large conductive area at both terminals. It should be noted that the first parasitic capacitor C1 is simplified in FIG. 1. The first parasitic capacitor C1 may be the sum of all related parasitic capacitance spread over the entire DOB module 100.

The current 130 from the first parasitic capacitor C1 may be conducted through the base metal substrate 104 and into the heat sink 126. From the heat sink 126, the current 130 may be detected by the EMI measuring network 124 through the PE connection 128 and may be coupled to other systems connected to the same ground. The current 130 may be detected and may be measured. If the current 130 is above a threshold, the DOB module 100 may fail an EMC test.

In addition to the first parasitic capacitor C1, a second parasitic capacitor C2 may be formed below the controller 120 due to the high frequency current in the base metal substrate 104 due to the parasitic AC coupling of the square wave voltage 132. The second parasitic capacitor C2 may cause internal disturbances within the controller 120. It should be noted that the second parasitic capacitor C2 is simplified in FIG. 1. The second parasitic capacitor C2 may occur at any device in the device layer 110.

The disturbances due to the second parasitic capacitor C2 may be greatly enhanced if the base metal substrate 104 is floating rather than being grounded through the heat sink 126. However, even when the base metal substrate 104 is grounded, the parasitic capacitive coupling from the switching transistor 118 to the controller 120 may be nonzero and may cause problems. This may be because the impedance of the long grounding path at high frequencies may be nonzero, and the base metal substrate 104 may still carry part of the square wave voltage 132 of the switching transistor 118 via the first parasitic capacitor C1 that may then couple to the controller 120 via the second parasitic capacitor C2.

As the power input 122 to the DOB module 100 is increased, the EMC problem may also increase. Increasing the thickness of the dielectric layer 106 may reduce the capacitance of the first parasitic capacitor C1 and the second parasitic capacitor C2, but may undesirably increase thermal resistance. Accordingly, it may be desirable to reduce EMI to more easily meet EMC standards.

Figure 2A:
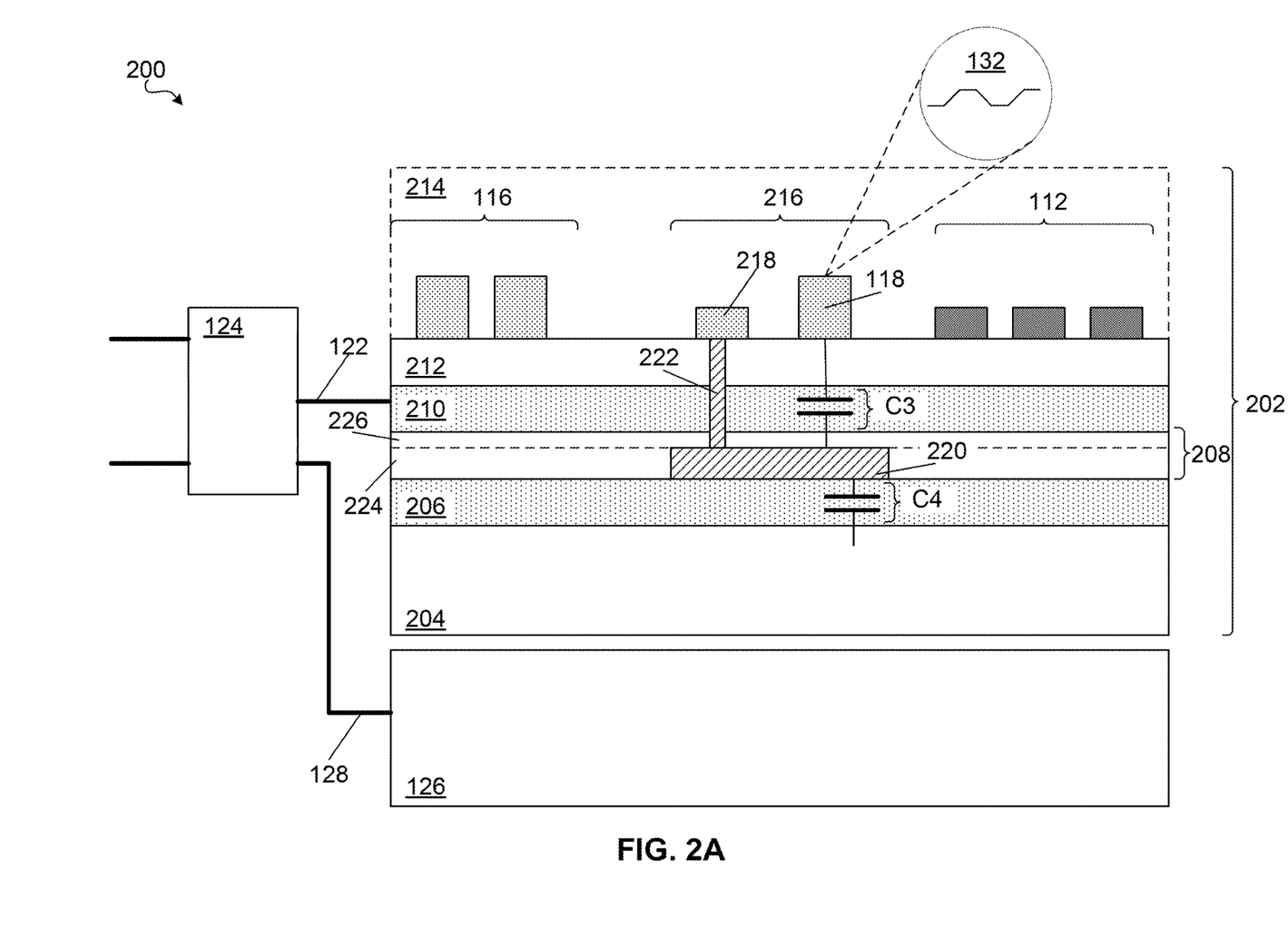
FIGS. 2A-2C are cross-sectional views of a DOB module on a multi-layer MCPCB with various configurations of local shielding.

Referring now to FIG. 2A, a cross-sectional view of a DOB module 200 on a multi-layer MCPCB 202 with local shielding is shown. The multi-layer MCPCB 202 may include a base metal substrate 204, a first dielectric layer 206 on the base metal substrate 204, a first patterned metal layer 208 on the first dielectric layer 206, a second dielectric layer 210 on the first patterned metal layer 208, a second patterned metal layer 212 on the second dielectric layer 210, and a device layer 214.

The base metal substrate 204 may be composed of one or more thermally conductive metals, such as, for example aluminum, copper, steel, and alloys thereof. The base metal substrate 204 may be, but is not limited to, several hundred microns thick. For example, the base metal substrate 204 may have a thickness ranging from approximately 0.5 mm to approximately 1.5 mm.

The base metal substrate 204 may have a first dielectric layer 206 formed thereon. The first dielectric layer 206 may include any thermally conductive dielectric materials, such as a dielectric polymer, a ceramic having a high thermal conductivity, and combinations thereof. The first dielectric layer 206 may comprise a single layer of dielectric material or multiple layers of dielectric materials. The first dielectric layer 206 may be formed using a conventional deposition or lamination process. The first dielectric layer 206 may have a thickness ranging from approximately 30 µm to approximately 150 µm.

The first dielectric layer 206 may have a first patterned metal layer 208 formed thereon. The first patterned metal layer 208 may provide one or more interconnections for circuitry in higher layers. The first patterned metal layer 208 may be composed of a conductive material, such as polySi, a conductive metal, an alloy comprising at least one conductive metal, a conductive metal silicide, or combinations thereof. Preferably, the conductive material may be a conductive metal, such as Cu, W, or Al. The conductive material may be formed utilizing a conventional deposition or lamination process.

Although shown as one layer, one skilled in the art would understand that the first patterned metal layer 208 may include multiple areas and/or layers of conductive material, insulated by one or more types of dielectric materials, for more complex circuits requiring cross-over conductors. The dielectric materials may be similar to the material in the first dielectric layer 206 and may be formed using similar techniques before being patterned by one or more conventional lithography techniques. The first patterned metal layer 208 may have a thickness ranging from approximately 9 µm to approximately 70 µm.

The first patterned metal layer 208 may have a second dielectric layer 210 formed thereon. The second dielectric layer 210 may be composed of similar materials as the first dielectric layer 206 and may be formed using similar techniques. The second dielectric layer 210 may have a thickness ranging from approximately 30 µm to approximately 150 µm.

The second dielectric layer 210 may have second patterned metal layer 212 formed thereon. The second patterned metal layer 212 may be composed of similar materials as the first patterned metal layer 208 and may be formed using similar techniques. The second patterned metal layer 212 may have a thickness ranging from approximately 9 µm to approximately 70 µm The device layer 214 may contain similar devices as those described above with reference to the device layer 110 in FIG. 1, including the one or more LEDs 112 and the other devices 112. The device layer may contain a shielded SMPS 216 that contains the switching transistor 118 carrying the square wave voltage 132 and a DC voltage node 218.

The DC voltage node 218 may be connected to a local shielding area 220 in the first patterned metal layer 208 by a conductive via 222. The local shielding area 220 may be located under any device that directly or indirectly carries a steep slope voltage waveform. As shown in FIG. 2A, the local shielding area 220 may be located under the switching transistor 118, which carries the square wave voltage 132. The local shielding area 220 may be a substantially continuous area of conductive material in the first patterned metal layer 208. The shielding area may be composed of a conductive metal, such as, for example, Cu, W, or Al.

The shielding area 220 may be formed simultaneously with the formation of first patterned metal layer 208. In an example, a first portion 224 of the first patterned metal layer 208 may be deposited on the first dielectric layer 206. The first portion 224 may be composed of a dielectric material similar to the dielectric material of the first dielectric layer 206. The first portion 224 may be patterned and etched using a conventional lithography process to form an opening. The opening may be filed with the conductive material using a conventional deposition process, such as, but not limited to, CVD, PECVD, sputtering, chemical solution deposition, or plating. After the conductive material is deposited, it may be planarized by a conventional process such as, chemical mechanical planarization (CMP), such that an upper surface of the conductive material is substantially flush with an upper surface of the first portion. A second portion 226 of the first patterned metal layer 208 may be deposited on the first portion 224 to complete the first patterned metal layer 208. The second portion 226 may be composed of similar material as the first portion and formed using similar techniques.

The shielding area 220 may have a thickness ranging from approximately 9 μm to approximately 70 μm. The shielding area 220 may have a cross sectional area that is at least larger than the cross sectional area of the switching transistor 118 and the DC voltage node 218. Portions of the shielding area 220 may extend beyond an outer edge of the switching transistor 118 by a distance, which may be several micrometers or up to the entire width of the DOB module 200. Portions of the local shielding area 220 may extend beyond an outer edge of the DC voltage node 218 by a distance, which may be several micrometers or up to the entire width of the DOB module 200.

As described above, the local shielding area 220 may be physically and electrically connected to the DC voltage node 218 by the conductive via 222. The conductive via 222 may be formed by patterning and etching the second portion 226, the second dielectric layer 210 and the second patterned metal layer 212 using conventional lithography techniques. The patterning and etching may occur while each of the layers is being formed. The openings formed by the patterning and etching may be filled with a conductive a conductive metal, such as, for example, Cu, W, or Al, using a conventional deposition process such as those described above with reference to the shielding area 220. It should be noted that although the local shielding area 220 and the DC voltage node 218 are shown as connected by the conductive via 222, they may be connected by other means, such as a shunt or an external conductor.

The DC voltage node 218 may be a ground node, the input voltage node or any other relatively stable node that can sink current. The DC voltage in the DC voltage node 218 may be taken from any node or device in the DOB module 200. The DC voltage may be any voltage ranging from the internal ground (0 volt) or a few hundreds of volts. The voltage may be generated in any way and at any DC level unrelated to the square wave voltage 132 level. The DC voltage node 218 may supply a DC voltage and may be connected to the local shield area 220 with a low AC impedance at the high frequency range of the square wave voltage 132. If these conditions are met, the DC voltage node 218 and the local shielding area 220 may cut off parasitic capacitive coupling between the switching transistor 118 and other devices.

The shielding effect may be generated because the conductive via 222 is relatively short and its high frequency impedance is minimal. Accordingly, voltage in the local shielding area 220 may essentially be the same as the DC voltage potential of the DC voltage node 218 in the high frequency domain. This may effectively cut off capacitive AC coupling to the base metal substrate 204 and the heat sink 126 below the switching transistor 118.

As shown in FIG. 2A, there may be a third parasitic capacitance C3 between the switching transistor 118 and the local shielding area 220. The third parasitic capacitance C3 may be a result of one capacitor terminal being a terminal of the switching transistor 118 carrying the square wave voltage 132 and/or the second patterned metal layer 212 directly below the terminal and the other capacitor terminal being the local shielding area 220 in the area below the switching transistor 118. The second dielectric layer 210 may act as a capacitor dielectric.

The third parasitic capacitance C3 may be isolated from a fourth parasitic capacitance C4 between the local shielding area 220 and the base metal substrate 204. The fourth parasitic capacitance C4 may be a result of one capacitor terminal being the local shielding area 220 carrying the DC voltage and the other capacitor terminal being the base metal substrate 204. The first dielectric layer 210 may act as a capacitor dielectric. Accordingly, there may be no parasitic capacitive current flowing between the switching transistor 118 and the base metal substrate 204, or ultimately the switching transistor 118 and the heat sink 126 which would then travel to the EMI measuring network 124 through the physical earth (PE) connection 128.

If the local shielding area 220 is large enough, the parasitic capacitance outside the local shielding area 220 may be very small due to the long distance between parasitic capacitor terminals and the resulting coupling effect may be negligible. The local shielding area 220 may reduce the EMC problems caused by parasitic capacitive coupling.

As shown in FIG. 2A, the local shielding area 220 may be located only below circuitry that carries the high frequency/high power square wave voltage 132 caused by the switching of the switching transistor 118.

Figure 2B:
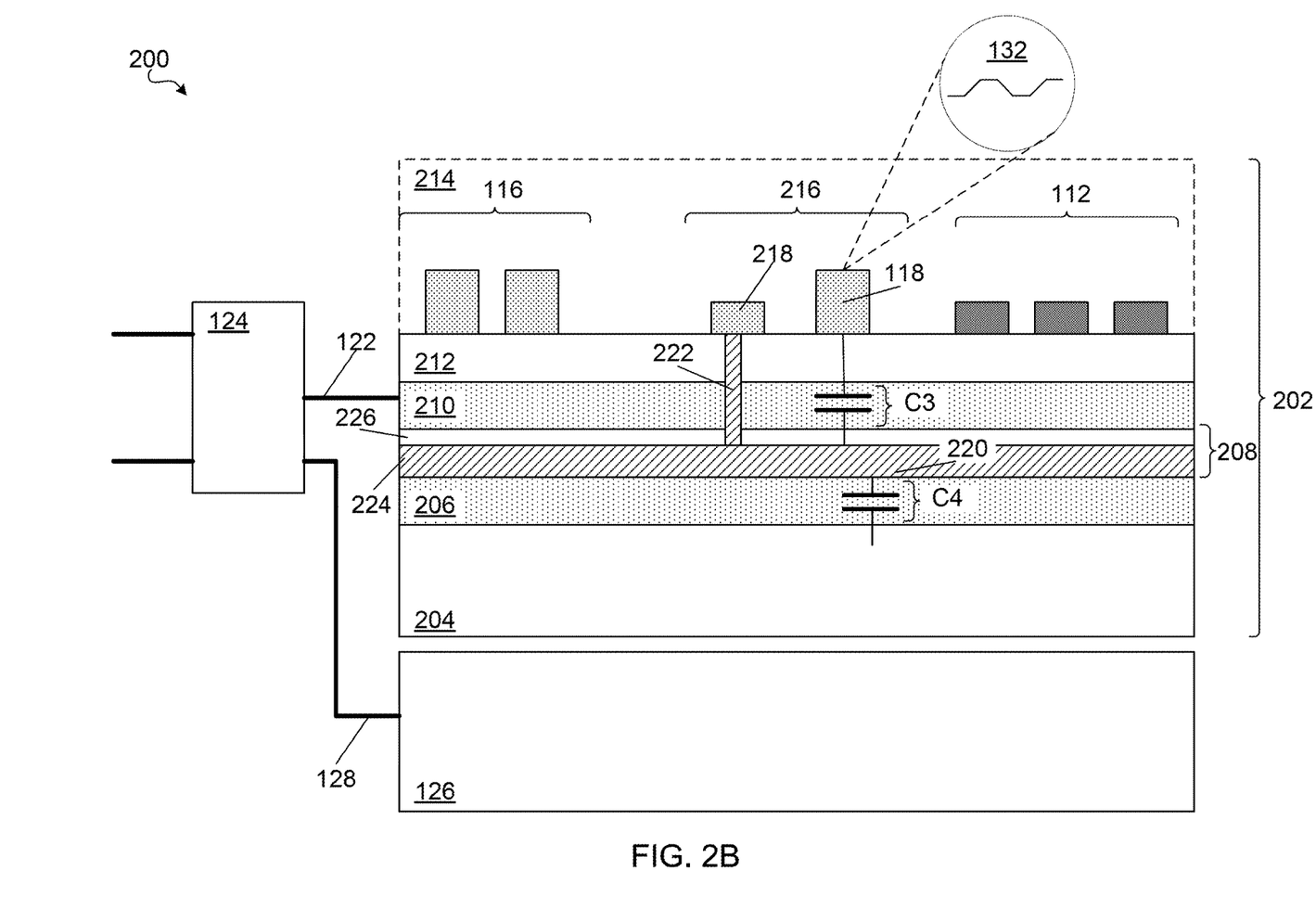

In another example, as shown in FIG. 2B, the local shielding area 220 may overlie the entire surface of the base metal substrate 204.

Figure 2C:
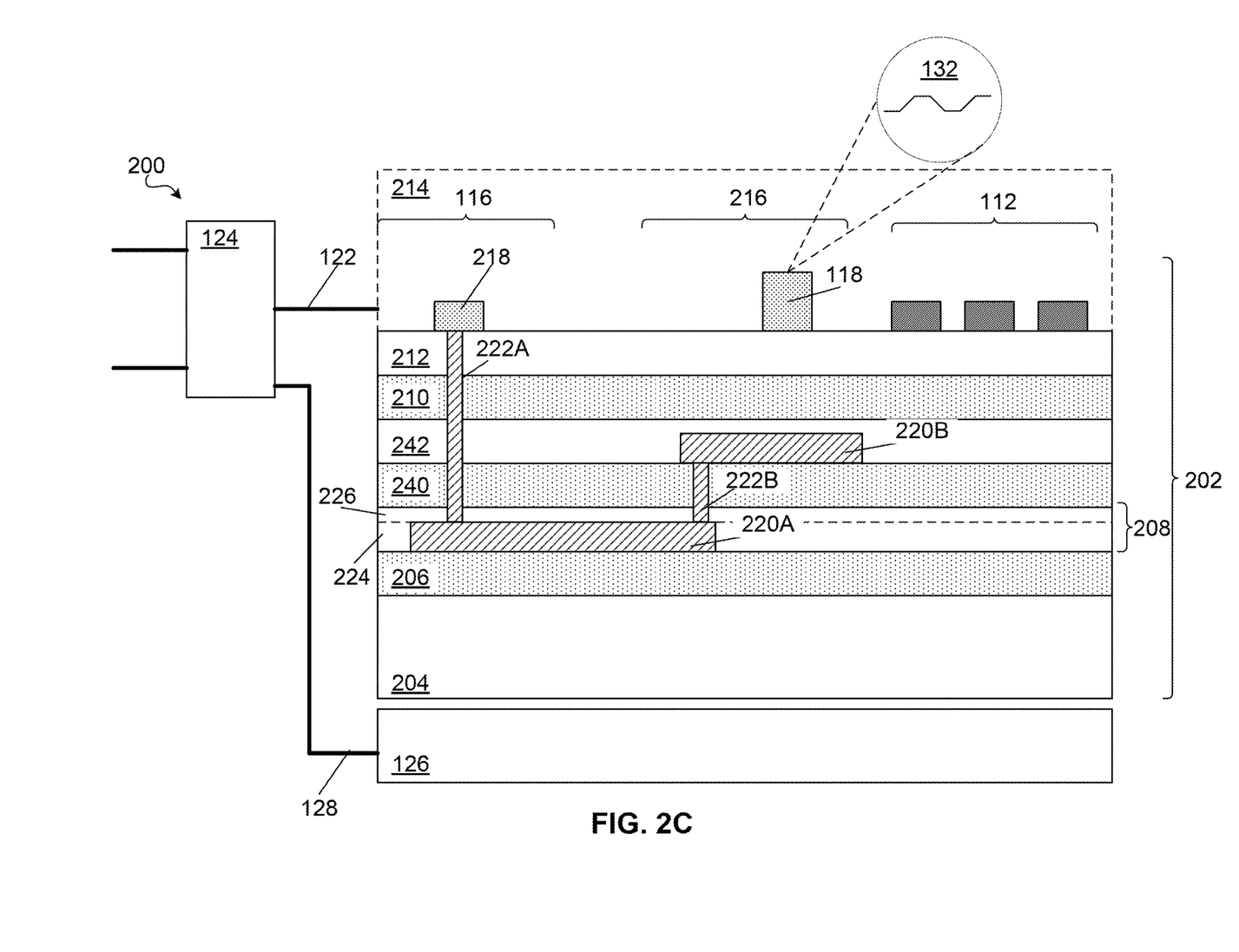

In another example, as shown in FIG. 2C, the DC voltage node 218 may not be in a suitable location to be directly connected to the local shielding area 220 below the switching transistor 118 to provide the local shielding. For example, the DC voltage node 218 may be located on another section of the multi-layer MCPCB 202 or may be external to the multi-layer MCPCB. An intermediate metal dielectric layer 240 may be formed on the first patterned metal layer 208. The intermediate dielectric layer 240 may be similar to the first dielectric layer 206 and may be formed using similar techniques. An intermediate patterned metal layer 242 may be formed on the intermediate dielectric layer 240. The intermediate patterned metal layer 242 may be similar to the first patterned metal layer 208 and may be formed using similar techniques. The second dielectric layer 210 may then be formed on the intermediate patterned metal layer 242.

The DC voltage node 218 may be connected to a first portion of 220A of the local shielding area in the first patterned metal layer 208 by a first conductive via 222A. The first portion 220A may carry the DC voltage laterally across the first patterned metal layer 208 to a second conductive via 222B. The second conductive via 222B may extend through the intermediate dielectric layer 240 and may be electrically connected to a second portion 220B of the local shielding area. As a result, a multi-layer local shielding area may be formed.

Figure 3:
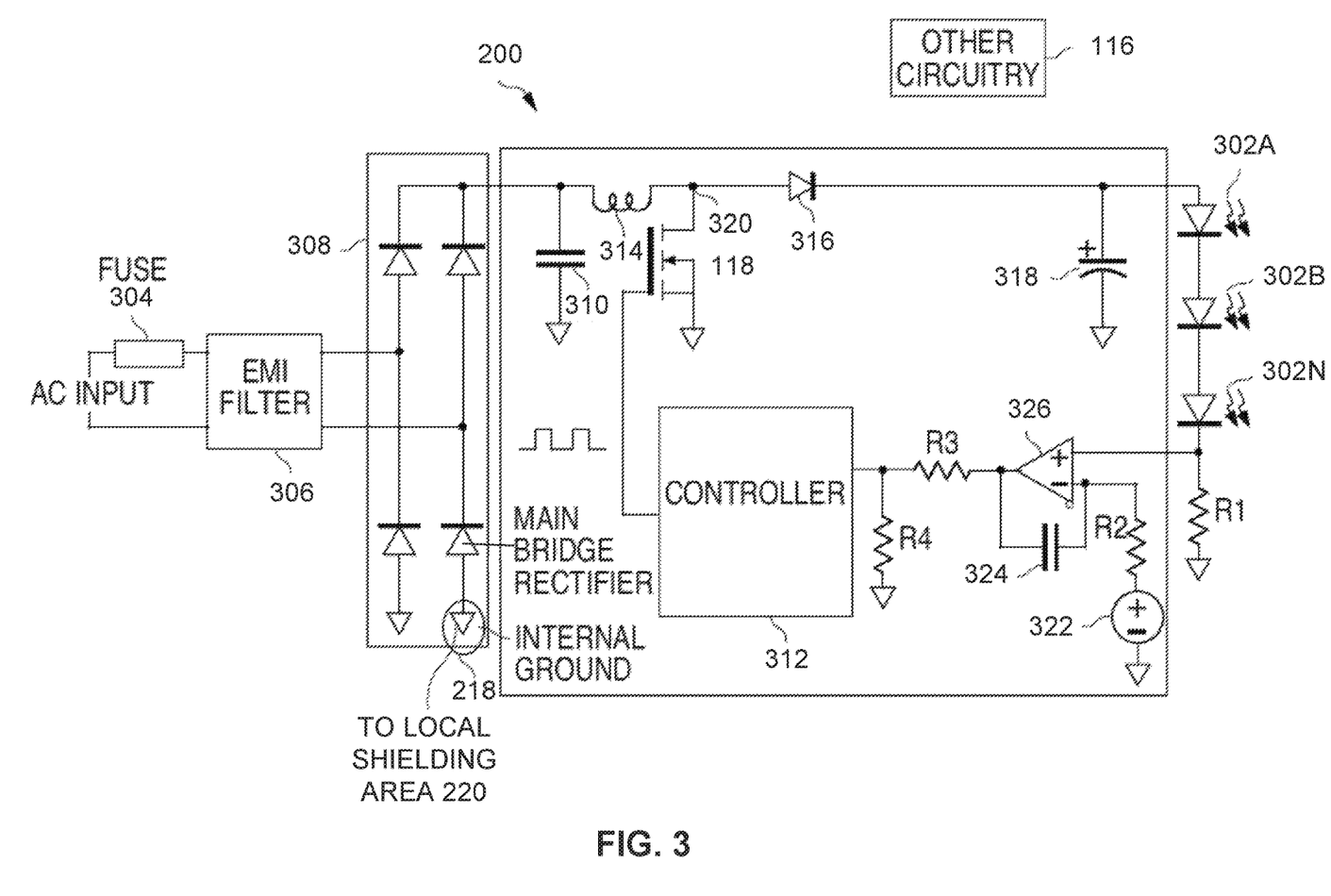
FIG. 3 is a circuit diagram illustrating an example of the DOB module using a single-stage boost convertor as a shielded switch-mode power supply (SMPS)

Referring now to FIG. 3, a circuit diagram illustrating an example of the DOB module 200 using a single-stage boost convertor as the shielded SMPS 216 is shown. The schematic represents a high power lighting module that may have an AC mains input and may drive one or more (e.g., 158) LEDs 302A-302N connected in series. Each of the one or more LEDs 302A-302N may be a blue-emitting GaN-based LED and may drop about 3 volts. Therefore, the boost circuit must boost the rectified AC mains voltage to at least 474 V. A phosphor may convert the blue LED light to white light for general illumination.

The AC mains voltage may be applied, via a fuse 304, to an EMI filter 306, which may or may not be on the MCPCB 202 illustrated in FIG. 2. A full diode bridge 308 may rectify the AC voltage and an input capacitor 310 may at least partially filter the rectified AC voltage. A controller 312 may turn on the switching transistor 118 and a right end of an inductor 314 may be pulled to ground for charging the inductor 314. At a particular time in the switching cycle to generate a target current through the one or more LEDs 302A-302N, the switching transistor 118 may be turned off. This may result in the voltage at the right end of the inductor 314 rising to forward bias a diode 316. This may recharge an output capacitor 318, which may smooth the waveform and essentially supply a DC voltage at a regulated current to the one or more LEDs 302A-302N. Thus, the square wave voltage 132 in this case goes between ground and the voltage that forward biases the diode 316. A drain node 320 of the switching transistor 118 may carry the square wave voltage 132. Any high frequency ripple in the current supplied to the one or more LEDs 302A-302N may be acceptable since any high frequency ripple may not be perceived, as long as the peak current stays within the current rating of the one or more LEDs 302A-302N.

The current conducted by the one or more LEDs 302A-302N may flow through a low value resistor R1. The voltage across the resistor R1 may be compared to a voltage generated by a controllable voltage source 322 acting as a dimmer control circuit. A resistor R2 and a capacitor 324 may filter the output of a differential amplifier 326 that may act as an error amplifier. The feedback network may control the duty cycle or switching frequency of the switching transistor 118 so that the voltages applied to the inputs of the differential amplifier 326 match. A voltage divider (resistors R3 and R4) may apply a divided voltage to the controller 312 that uses the error signal to control the switching of the switching transistor 118.

The controller 312 may cause a self-oscillation that is triggered by a zero current conducted by the inductor 314. Alternatively, or additionally, the controller 312 may be a pulse width modulation (PWM) controller that uses a fixed oscillator frequency to turn back on the switching transistor 118 for each cycle. Alternatively, or additionally, the controller 312 may use other known techniques to generate a target driving current for the one or more LEDs 302A-302N. The SMPS 216 may also be a current mode or voltage mode regulator.

In this example, the DC voltage node 218 may be an internal ground in the full diode bridge 308 that is electrically coupled to the local shielding area 220 to provide local shielding.

Figure 4:
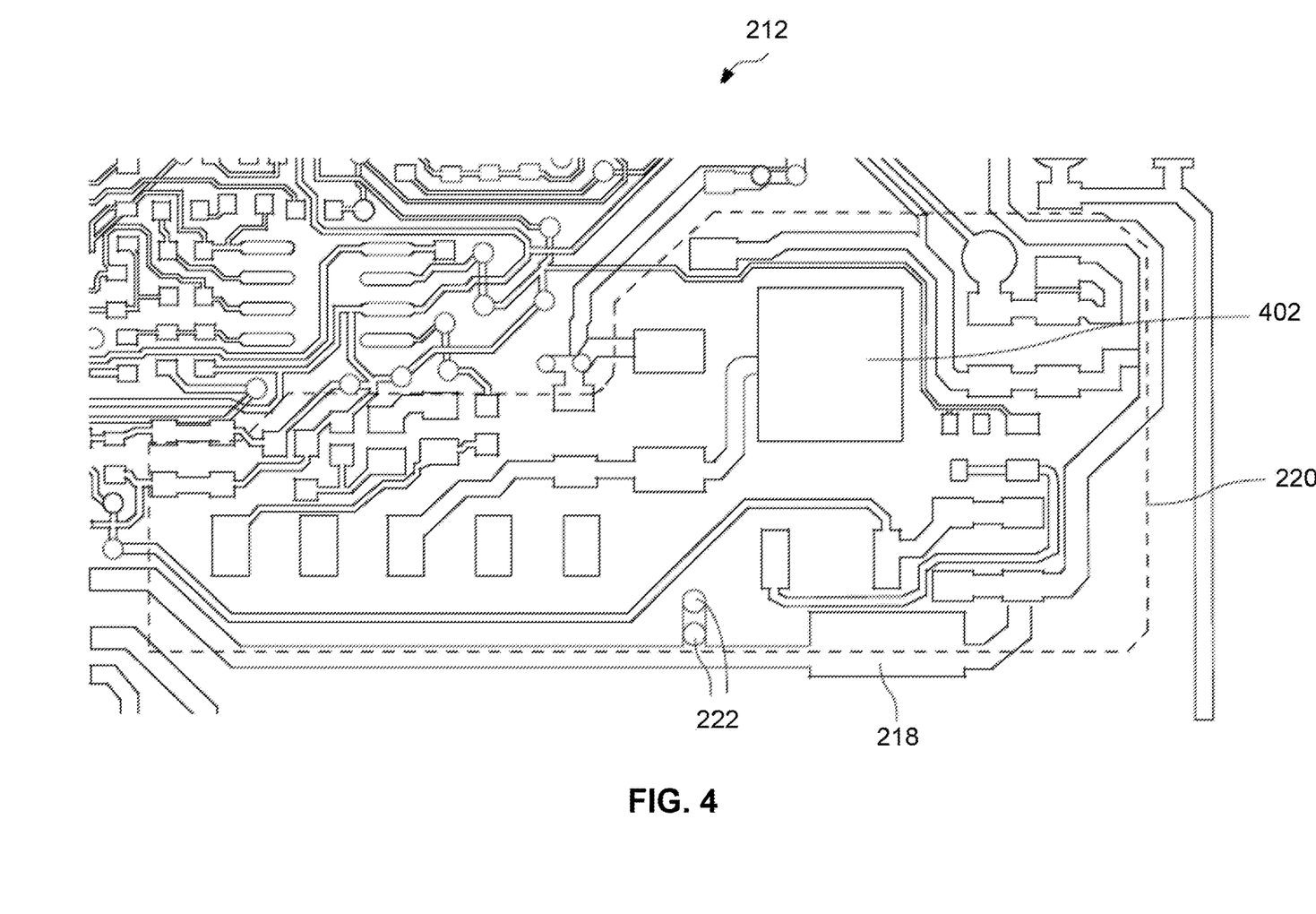
FIG. 4 is an overhead transparent view of a second patterned metal layer and a local shielding area of the shielded DOB module.

Referring now to FIG. 4, an overhead transparent view of the second patterned metal layer 212 and the local shielding area 220 of the shielded DOB module 200 is shown. As shown FIG. 4, the second patterned metal layer 212 is overlaid above the local shielding area 220. A drain node 402 of the switching transistor 118 is shown. The drain node 402 may electrically connect the switching transistor 118 to the underlying second patterned metal layer 212. The drain node 402 may be a copper pad or bonded wire connected a drain of the switching transistor 118. The drain node 402 is shown connected to other portions of the DOB module 200 via an interconnect pattern in the patterned metal layer 212. The interconnect pattern may be composed of a conductive material, such as, for example, Cu, W, or Al. As described above, the interconnect pattern may be formed by one or more conventional etching and deposition processes. The interconnect pattern may carry the square wave voltage 132. The local shielding area 220 may extend beyond the footprint of the portion of the second patterned metal layer 212 that carries the square wave voltage 132 to shield the underlying base metal substrate 204 from that to reduce any significant AC coupling.

The various electrical components shown in FIG. 3 may be mounted to the second patterned metal layer 212 via a conventional manner, such as a soldering process. In this example, the DC voltage node 218 for biasing the local shielding area may be the internal ground shown in FIG. 3. Two examples of the conductive via 222 are shown connecting the DC voltage node 218 to the local shielding area 220.

As described above, various other DC nodes in the second patterned metal layer 212 may also be used for an electrical connection to the local shielding area 220. The local shielding area 220 may extend well beyond the areas of the second patterned metal layer 212 that carry the square wave voltage in order to be located below a suitable DC voltage node for connection to that node by a vertical conductive via 222.

In the example shown in FIG. 4, the local shielding area 220 is not positioned below the heat generating one or more LEDs 302A-302N, since the one or more LEDs 302A-302N may conduct a substantial DC current due to smoothing by the output capacitor 318. Therefore, there may be good heat coupling between the one or more LEDs 302A-302N and the base metal substrate 204. There may be only one thin dielectric layer between the LEDs 302A-302N and the base metal substrate 204 to improve thermal conductance.

Certain portions of the SMPS 216 may be external to the MCPCB 202, such as large capacitors and inductors and current-setting components. The one or more switching transistors 118, as well as the control circuitry, will normally be mounted on the MCPCB to achieve the benefits of an on-board driver.

Although the examples provided above show the multi-layer MCPCB 202 being used for sinking heat from LEDs, the multi-layer MCPCB 202 may be used to sink heat from other heat-generating components mounted on the same multi-layer MCPCB 202 as the SMPS 216, such as a microprocessor.

Although it is known to provide three-dimensional printed circuits for complex circuitry, where multiple insulated levels of copper are needed for cross-overs, such copper patterns underlying a top copper pattern may not be for AC shielding of high frequency/high power square waves and are not biased by a DC voltage from a node in the top copper layer to achieve the AC shielding function.

Although features and elements are described above in particular combinations, one of ordinary skill in the art will appreciate that each feature or element can be used alone or in any combination with the other features and elements. In addition, the methods described herein may be implemented in a computer program, software, or firmware incorporated in a computer-readable medium for execution by a computer or processor. Examples of computer-readable media include electronic signals (transmitted over wired or wireless connections) and computer-readable storage media. Examples of computer-readable storage media include, but are not limited to, a read only memory (ROM), a random access memory (RAM), a register, cache memory, semiconductor memory devices, magnetic media such as internal hard disks and removable disks, magneto-optical media, and optical media such as CD-ROM disks, and digital versatile disks (DVDs).

What is claimed is:

1. A light emitting diode (LED) module comprising:
   a direct current (DC) voltage node formed on a first layer, the DC voltage node configured to sink a first current;

one or more devices formed on the first layer configured to provide a second current to one or more LEDs, wherein a device of the one or more devices carries a steep slope voltage waveform;

a local shielding area formed in a second layer below at least a portion of the DC voltage node and the one or more devices, the local shielding area comprising a substantially continuous area of conductive material; and a conductive via extending through one or more layers, the conductive via electrically coupling the DC voltage node and the local shielding area.

2. The LED module of claim 1, wherein the conductive via extends through an entire thickness of the first layer, an entire thickness of a first dielectric layer formed between the first layer and the second layer, and a portion of the second layer.

3. The LED module of claim 1, wherein the second layer is formed on a second dielectric layer and the second dielectric layer is formed on a base metal substrate.

4. The LED module of claim 1, wherein the local shielding area extends laterally beyond an outer edge of the DC voltage node and an outer edge of the device carrying the steep slope voltage waveform.

5. The LED module of claim 1, wherein the device carrying the steep slope voltage waveform comprises a switching transistor that square wave voltage waveform from an AC voltage input.

6. A module comprising:
a light emitting diode (LED) driver circuit comprising a switching circuit and a voltage node;
a multilayer electronics board comprising a first layer electrically coupled to the switching circuit and the voltage node, a second layer including a local shielding area, and one or more dielectric layers; and
a plated via extending from the local shielding area to the voltage node through at least the first layer and a first dielectric layer of the one or more dielectric layers.

7. The module of claim 6, wherein the local shielding area comprises a continuous region of a conductive metal.

8. The module of claim 6, wherein the voltage node is configured to provide an internal ground during operation of the LED driver circuit.

9. The module of claim 6, wherein the multilayer electronics board further comprises a base layer, the base layer providing an attachment area to a heat sink.

10. The module of claim 6, wherein the switching circuit comprises a single-stage boost converter circuit.

11. The module of claim 6, wherein the local shielding area extends laterally in two directions below at least a portion of the LED driver circuit.

12. The module of claim 6, wherein the switching circuit is configured to provide a square-wave voltage signal to an LED array.

13. The module of claim 6, further comprising an LED array, the LED array electrically coupled to the LED driver circuit.

14. A method comprising:
forming a light emitting diode (LED) driver circuit comprising a switching circuit and a voltage node;
forming a multilayer electronics board comprising a first layer electrically coupled to the switching circuit and the voltage node, a second layer including a local shielding area, and one or more dielectric layers; and
forming a plated via through at least the first layer and a first dielectric layer of the one or more dielectric layers, the plated via electrically coupling the voltage node and the local shielding area.

15. The method of claim 14, wherein the local shielding area comprises a continuous region of a conductive metal.

16. The method of claim 14, wherein the voltage node is configured to provide an internal ground during operation of the LED driver circuit.

17. The method of claim 14, wherein the multilayer electronics board further comprises a base layer, the base layer providing an attachment area to a heat sink.

18. The method of claim 14, wherein the switching circuit comprises a single-stage boost converter circuit.

19. The method of claim 14, wherein the local shielding area extends laterally in two directions below at least a portion of the LED driver circuit.

20. The method of claim 14, wherein the switching circuit is configured to provide a square-wave voltage signal to an LED array on the first layer.

* * * * *